(12) United States Patent
Lee et al.

(10) Patent No.: US 9,962,801 B2
(45) Date of Patent: May 8, 2018

(54) SYSTEMS AND METHODS FOR PERFORMING CHEMICAL MECHANICAL PLANARIZATION

(71) Applicant: Taiwan Semiconductor Manufacturing Company Limited, Hsinchu (TW)

(72) Inventors: Shen-Nan Lee, Hsinchu (TW); Teng-Chun Tsai, Hsinchu (TW); Yung-Cheng Lu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 62 days.

(21) Appl. No.: 14/148,870

(22) Filed: Jan. 7, 2014

(65) Prior Publication Data
US 2015/0194318 A1 Jul. 9, 2015

(51) Int. Cl.
| | |
|---|---|
| *H01L 21/306* | (2006.01) |
| *B24B 37/005* | (2012.01) |
| *B24B 37/04* | (2012.01) |
| *B24B 1/04* | (2006.01) |
| *H01L 21/321* | (2006.01) |
| *H01L 21/67* | (2006.01) |
| *H01L 21/02* | (2006.01) |
| *H01L 21/768* | (2006.01) |

(Continued)

(52) U.S. Cl.
CPC ............. *B24B 1/04* (2013.01); *B24B 37/005* (2013.01); *B24B 37/04* (2013.01); *B24B 37/044* (2013.01); *H01L 21/02024* (2013.01); *H01L 21/3212* (2013.01); *H01L 21/32115* (2013.01); *H01L 21/67115* (2013.01); *H01L 21/67219* (2013.01); *B24B 37/11* (2013.01); *B24B 37/30* (2013.01); *H01L 21/7684* (2013.01)

(58) Field of Classification Search
USPC ............ 156/345.12, 345.13, 345.14, 345.15, 156/345.16
See application file for complete search history.

(56) References Cited

U.S. PATENT DOCUMENTS

| | | |
|---|---|---|
| 5,084,071 A | 1/1992 | Nenadic et al. |
| 5,770,095 A | 6/1998 | Sasaki et al. |
| 6,068,787 A | 5/2000 | Grumbine et al. |

(Continued)

FOREIGN PATENT DOCUMENTS

TW 201034794 10/2010

OTHER PUBLICATIONS

Office Action; Taiwan Patent Application No. 103146018; dated Dec. 9, 2016.

*Primary Examiner* — Sylvia R MacArthur
(74) *Attorney, Agent, or Firm* — Jones Day

(57) ABSTRACT

Systems and methods are provided for performing chemical-mechanical planarization. An example system includes: a polishing head, a polishing pad, a slurry distribution component, and a reactant distribution component. The polishing head is configured to perform chemical-mechanical planarization on an article. The polishing pad is configured to support the article. The slurry distribution component is configured to provide a slurry on the polishing pad. The reactant distribution component is configured to provide an oxidizer material on the polishing pad to generate a plurality of radicals to react with the article.

20 Claims, 6 Drawing Sheets

(51) Int. Cl.
*B24B 37/11* (2012.01)
*B24B 37/30* (2012.01)

(56) References Cited

U.S. PATENT DOCUMENTS

| | | | |
|---|---|---|---|
| 6,183,351 B1* | 2/2001 | Aoki | 451/60 |
| 6,284,092 B1* | 9/2001 | Manfredi | B24B 57/02 |
| | | | 156/345.12 |
| 6,326,299 B1 | 12/2001 | Homma et al. | |
| 6,503,129 B1* | 1/2003 | Gotkis | B24B 53/017 |
| | | | 451/446 |
| 9,205,529 B2* | 12/2015 | Ham | B24B 57/02 |
| 2002/0016073 A1* | 2/2002 | Kondo | B24B 37/044 |
| | | | 438/691 |
| 2004/0002292 A1* | 1/2004 | Fukushima et al. | 451/41 |
| 2005/0092620 A1* | 5/2005 | Mavliev et al. | 205/662 |
| 2010/0048106 A1* | 2/2010 | Wang | B24B 37/04 |
| | | | 451/60 |
| 2010/0101497 A1* | 4/2010 | Izuta | H01L 21/67051 |
| | | | 118/730 |
| 2014/0199840 A1* | 7/2014 | Bajaj | H01L 21/30625 |
| | | | 438/692 |
| 2015/0194318 A1* | 7/2015 | Lee | H01L 21/32115 |
| | | | 438/693 |

* cited by examiner

SYSTEMS AND METHODS FOR PERFORMING CHEMICAL MECHANICAL PLANARIZATION

FIELD

The technology described in this disclosure relates generally to material processing and more particularly to chemical-mechanical planarization.

BACKGROUND

Semiconductor device fabrication usually involves many processes, including a rough polishing and/or a finish polishing for generating a smooth surface on a wafer. The finish polishing is usually performed using a slurry which often contains a mixture of minerals, sludge or other suitable materials dispersed in liquid. For example, the slurry contains colloidal silica which is a compound of amorphous anhydrous silicic acid in a colloidal state, and abrasive particles used for chemical-mechanical planarization/polishing (CMP).

DETAILED DESCRIPTION

Figure 1:
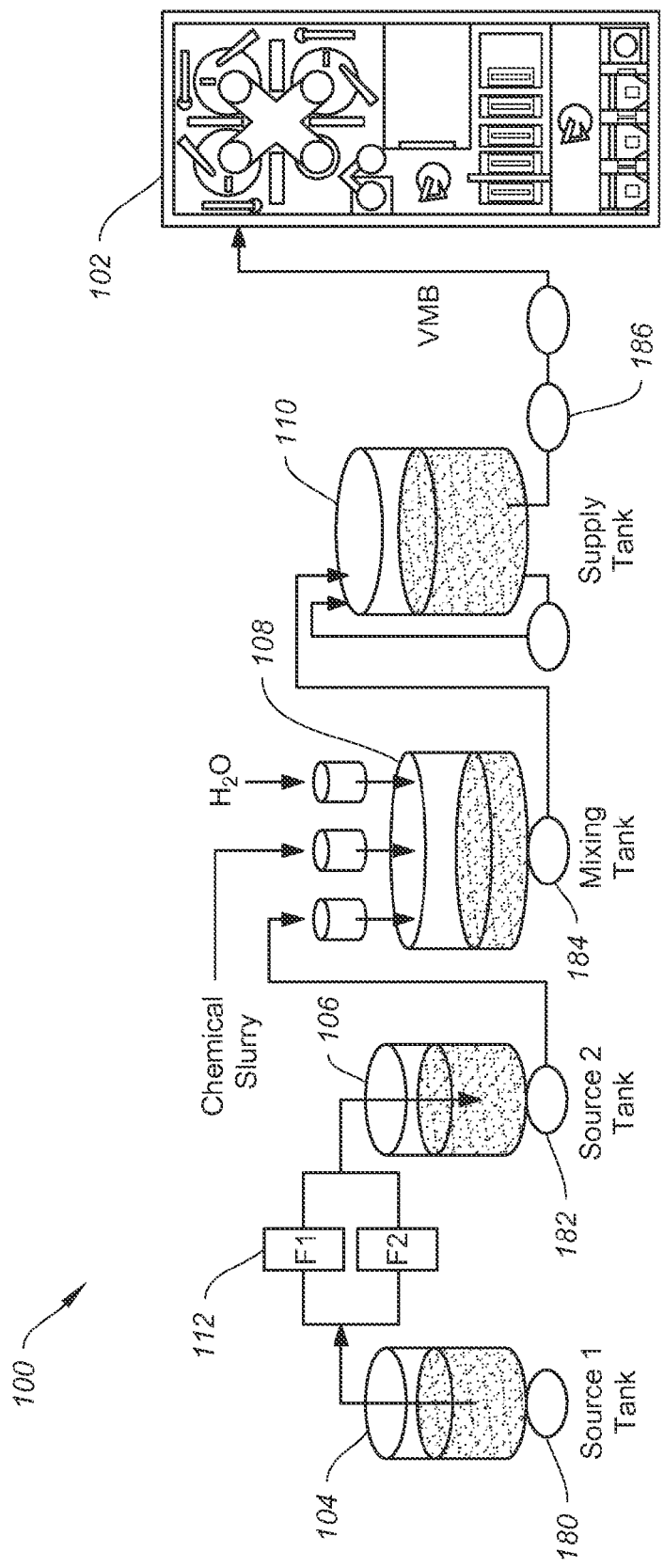
FIG. 1 depicts an example diagram showing a slurry-supplying system for chemical-mechanical planarization (CMP).

FIG. 1 depicts an example diagram showing a slurry-supplying system for chemical-mechanical planarization. The system 100 supplies a diluted slurry to a CMP apparatus 102 for chemical-mechanical planarization (CMP). As shown in FIG. 1, a stock slurry (e.g., an undiluted slurry containing colloidal silica) is transferred from a source tank 104 to another source tank 106, and then is provided from the source tank 106 to a mixing tank 108. One or more diluents are added into the mixing tank 108 to dilute the stock slurry. The diluted slurry is then transferred to a supply tank 110 which supplies the diluted slurry to the CMP apparatus 102 for performing CMP on an article.

Specifically, the stock slurry is transferred from the source tank 104 to the source tank 108 using one or more liquid-delivery pumps 180. For example, the stock slurry includes $CeO_2$-based materials, $Al_2O_3$-based materials, $SiO_2$-based materials, or other suitable materials. One or more mass flow controllers 112 are used to control flow rates of the stock slurry that flows from the source tank 104 to the source tank 106. A filter (not shown) is placed between the source tank 104 and the source tank 106 to remove particles equal to or larger than a predetermined size from the stock slurry. One or more liquid-delivery pumps 182 are used to pressurize the stock slurry out of the source tank 106 toward the mixing tank 108. The slurry is diluted at a predetermined proportion with one or more diluents (e.g., one or more chemical materials and/or pure water) in the mixing tank 108. For example, concentrated ammonia water and pure water are introduced into the mixing tank 108 to mix with the slurry. A stirrer (not shown) may be used to stir and mix the slurry with the diluents. The diluted slurry is then transferred to the supply tank 110 using one or more liquid-delivery pumps 184. An ultrasonic processing device (not shown) may be disposed in the supply tank 110 to process the diluted slurry, and one or more liquid-delivery pumps 186 are used to transfer the diluted slurry to the CMP apparatus 102. Another filter (not shown) may be used after the liquid-delivery pumps 186 to filter the diluted slurry flowing out of the supply tank 110 to remove particles equal to or larger than a predetermined size before the diluted slurry is provided to the CMP apparatus 102.

A wafer for semiconductor device fabrication is processed in the CMP apparatus 102. To expedite the CMP process, oxidizers, such as hydrogen peroxide ($H_2O_2$), sodium hypochlorite (NaOCl) and potassium iodate ($KIO_3$), may be added to the slurry in the mixing tank 108. The oxidizers can react with certain materials (e.g., polymer materials) in the wafer so that the wafer is polished faster during the CMP process. However, adding the oxidizers in the mixing tank 108 has some disadvantages. For example, the oxidizers react with other chemical materials and/or the slurry in the mixing tank 108, which negatively affects the chemical stability of the slurry. In another example, before the oxidizers can react with the wafer in the CMP apparatus 102, the oxidizers are transferred to the supply tank 110 and then transferred to the CMP apparatus 102. The oxidizers may degrade and decompose during such a long transferring process.

Figure 2:
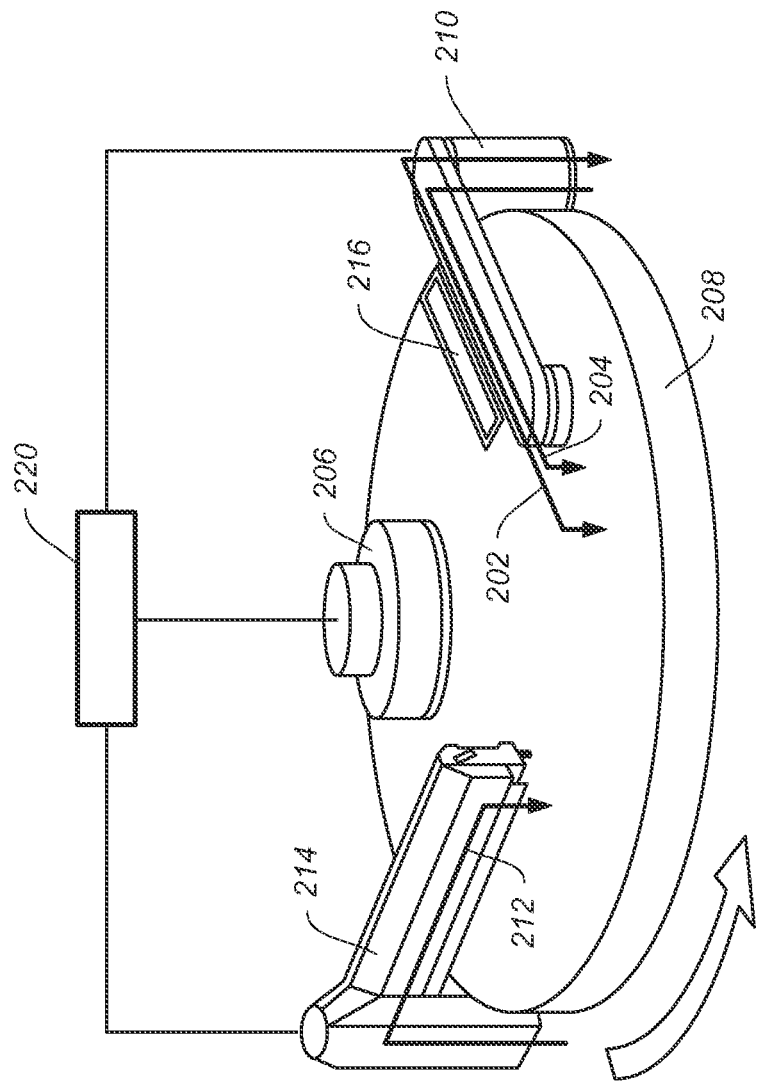
FIG. 2 depicts an example diagram of a CMP apparatus as shown in FIG. 1.

FIG. 2 depicts an example diagram of the CMP apparatus 102. As shown in FIG. 2, an oxidizer material 202 and a catalyst material 204 are introduced directly into the CMP apparatus 102 during a CMP process on a wafer (not shown). A plurality of radicals are generated based on the catalyst material 204 and the oxidizer material 202 and react with the wafer so as to expedite the CMP process.

Specifically, the CMP apparatus 102 includes a polishing head 206, a polishing pad 208, a reactant distribution component 210, and a slurry distribution component 214. In certain embodiments, the polishing head 206 rotates and oscillates to bring the wafer (not shown) into contact with the polishing pad 208 that moves in the plane of the wafer surface to be planarized. A slurry (e.g., a diluted slurry) 212 is introduced on the polishing pad 208 through the slurry distribution component 214. For example, the slurry 212 includes an abrasive and corrosive chemical solution (e.g., a colloid). Separately from the slurry 212, the oxidizer material 202 and the catalyst material 204 are introduced on the polishing pad 208 through the reactant distribution component 210. For example, the oxidizer material 202 includes hydrogen peroxide, and the catalyst material 204 includes an iron-based material. The oxidizer material 202 and the catalyst material 204 are introduced on the polishing pad 208 through two different conduits (e.g., pipes, tubes) respectively. The plurality of radicals are generated from the oxidizer material 202 with the assistance of the catalyst material 204 and react with certain materials (e.g., polymer materials) in the wafer (not shown) that is supported by the polishing pad 208. In some embodiments, the CMP apparatus 102 further includes a light source 216 that emits an incident light (e.g., ultraviolet light) on the oxidizer material 202 for generation of the radicals. In certain embodiments, the CMP apparatus 102 further includes a controller 220 configured to control the polishing head 206, the reactant distribution component 210, and the slurry distribution component 214. The polishing pad 208 may be attached to a polishing platen (not shown).

Figure 3:
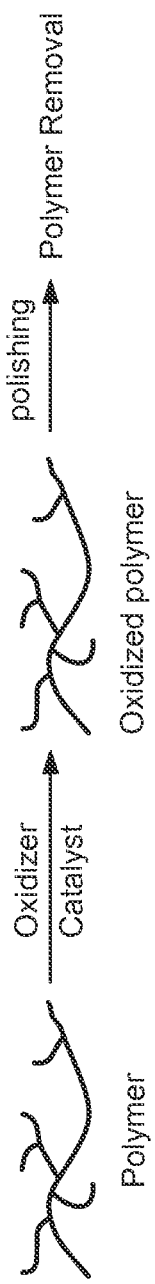
FIG. 3 depicts an example diagram for oxidization of the wafer.

FIG. 3 depicts an example diagram for oxidization of the wafer. As shown in FIG. 3, certain materials (e.g., polymer materials) in the wafer are oxidized by a plurality of radicals generated based on the oxidizer material 202 with the assistance of the catalyst material 204. The products of the reaction between the radicals and the wafer (e.g., oxidized polymer materials) are removed during the CMP process.

In some embodiments, the radicals are generated through Fenton's reactions. For example, ferrous irons ($Fe^{2+}$) included the catalyst material 204 are oxidized by the oxidizer material 202 (e.g., hydrogen peroxide) to generate ferric irons ($Fe^{3+}$), hydroxyl radicals (.OH) and hydroxyl anions ($OH^-$). Then, Ferric irons ($Fe^{3+}$) react with the oxidizer material (e.g., hydrogen peroxide) to generate ferrous irons ($Fe^{2+}$), superoxide radicals (HOO.), and protons ($H^+$). The Fenton's reactions may include one or more of the following reactions:

$$Fe^{2+} + H_2O_2 \rightarrow Fe^{3+} + .OH + OH^-$$

$$Fe^{2+} + .OH \rightarrow Fe^{3+} + OH^-$$

$$.OH + H_2O_2 \rightarrow HO_2. + H_2O$$

$$Fe^{2+} + HO_2. \rightarrow Fe(HO_2)^{2+}$$

$$Fe^{3+} + HO_2. \rightarrow Fe^{2+} + O_2 + H^+$$

$$HO_2. \rightarrow O_2^-. + H^+$$

$$Fe^{3+} + HO_2. \rightarrow Fe^{2+} + O_2 + H^+$$

$$HO_2. + HO_2. \rightarrow H_2O_2 + O_2$$

$$.OH + HO_2. \rightarrow H_2O + O_2$$

$$.OH + O_2. \rightarrow OH^- + O_2$$

$$.OH + .OH \rightarrow H_2O_2$$

The generated radicals engage in reactions (e.g., oxidation) with certain materials (e.g., polymer materials) of the wafer. For example, a polymer material (e.g., RH) reacts with the generated radicals (e.g., .OH) with the assistance of the catalyst material 204 to result in mainly carbon dioxide and water which are very easy to remove during the CMP process, as shown below:

$$RH + .OH \rightarrow R. + H_2O$$

$$R. + Fe^{3+} \rightarrow R^+ + Fe^{2+}$$

$$R^+ + O_2 \rightarrow ROO^+ \rightarrow \ldots \rightarrow CO_2 + H_2O$$

In some embodiments, ultraviolet light may be provided on the oxidizer material 202 (e.g., hydrogen peroxide) to generate certain radicals (e.g., hydroxyl radicals).

$$H_2O_2 \xrightarrow{UV} \cdot OH + \cdot OH$$

Figure 4:
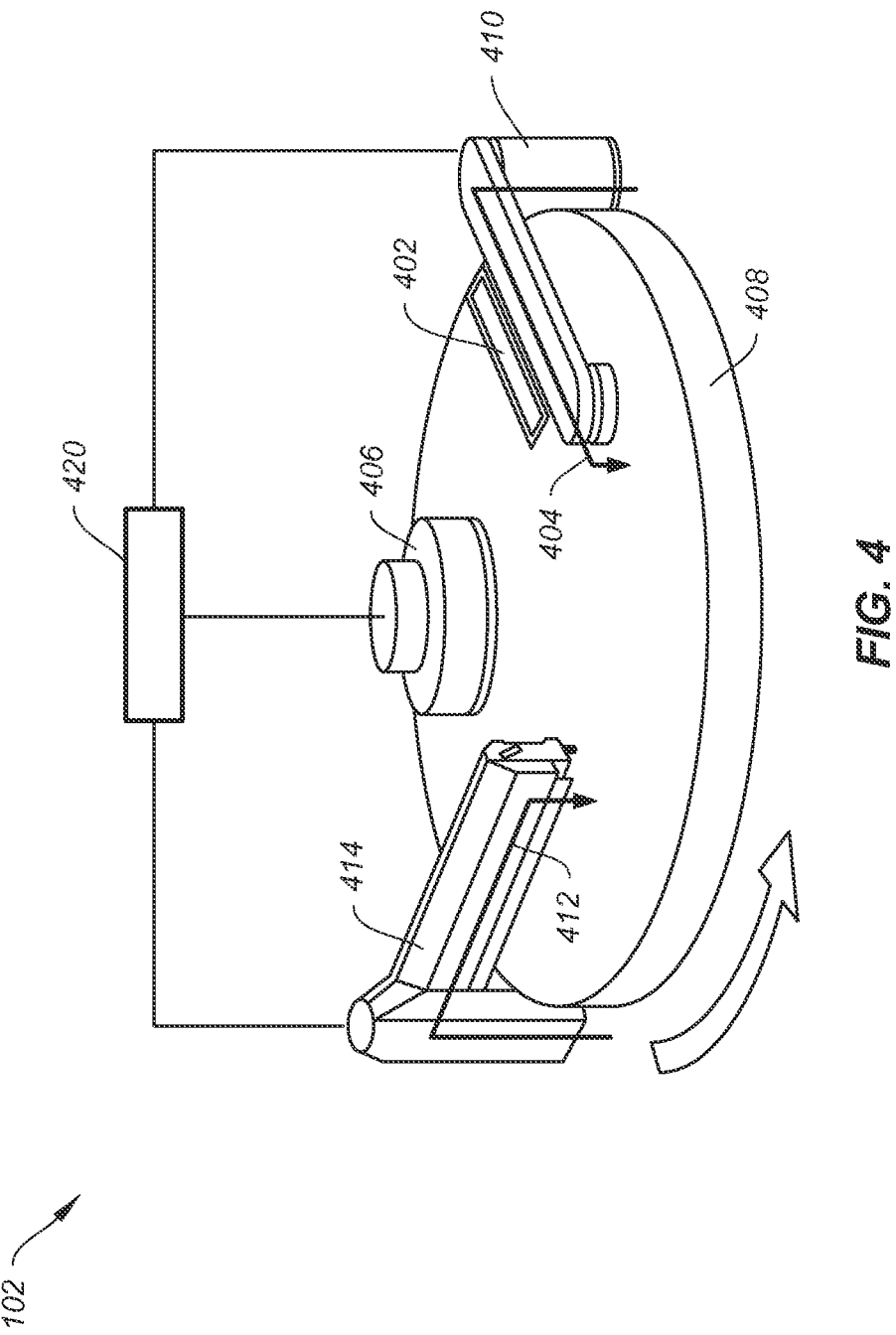
FIG. 4 depicts another example diagram of a CMP apparatus as shown in FIG. 1.

FIG. 4 depicts another example diagram of the CMP apparatus 102. As shown in FIG. 4, an oxidizer material 404 (e.g., ozone) is introduced directly into the CMP apparatus 102 during a CMP process on a wafer (not shown). A light source 402 provides an incident light (e.g., ultraviolet light) on the oxidizer material 404 to generate a plurality of radicals that react with the wafer so as to expedite the CMP process.

Specifically, the CMP apparatus 102 includes a polishing head 406, a polishing pad 408, a reactant distribution component 410, and a slurry distribution component 414. A slurry (e.g., a diluted slurry) 412 is introduced on the polishing pad 408 through the slurry distribution component 414. Separately, the oxidizer material 404 is introduced on the polishing pad 408 through the reactant distribution component 410. For example, the oxidizer material 202 includes ozone. The plurality of radicals are generated by the incident light (e.g., ultraviolet light) shining on the oxidizer material 404 through the following reaction:

$$O_3 \xrightarrow{UV} O_2 + O \cdot$$

The generated radicals (e.g., O.) react with certain materials (e.g., polymer materials) in the wafer (not shown) that is supported by the polishing pad 408. In certain embodiments, the CMP apparatus 102 further includes a controller 420 configured to control the polishing head 406, the reactant distribution component 410, and the slurry distribution component 414.

Figure 5:
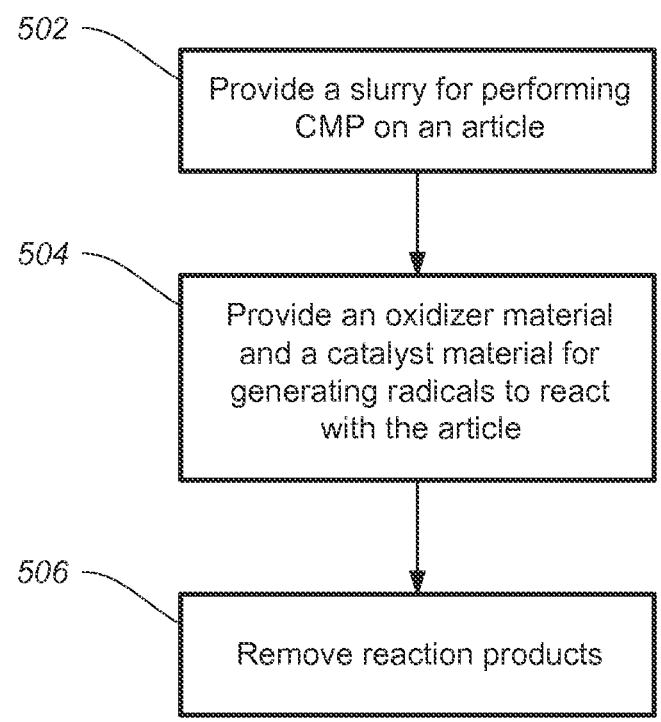
FIG. 5 depicts an example flow diagram for performing CMP.

FIG. 5 depicts an example flow diagram for performing CMP. At 502, a slurry is provided for performing CMP on an article (e.g., a wafer). At 504, an oxidizer material (e.g., hydrogen peroxide) and a catalyst material (e.g., an iron-based material) on the article for generating a plurality of radicals to react with the article. At 506, products (e.g., carbon dioxide, water) generated from the reaction between the radicals and the article are removed during the CMP process.

In some embodiments, the slurry includes an abrasive and corrosive chemical solution (e.g., a colloid). The oxidizer material and the catalyst material are provided separately from the slurry. The oxidizer material and the catalyst material are introduced through two different conduits (e.g., pipes, tubes) respectively. The plurality of radicals are generated from the oxidizer material with the assistance of the catalyst material and react with certain materials (e.g., polymer materials) in the article. In certain embodiments, an incident light (e.g., ultraviolet light) is provided on the oxidizer material for generation of the radicals.

Figure 6:
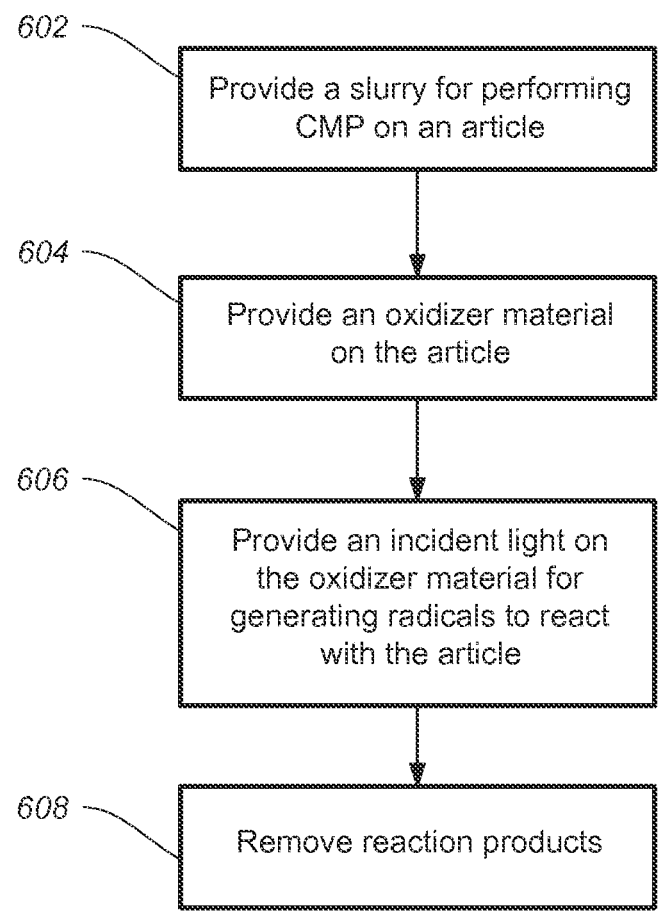
FIG. 6 depicts another example flow diagram for performing CMP.

FIG. 6 depicts another example flow diagram for performing CMP. At 602, a slurry is provided for performing CMP on an article (e.g., a wafer). At 604, an oxidizer material (e.g., ozone) is provided on the article. At 606, an incident light (e.g., ultraviolet light) on the oxidizer material for generating a plurality of radicals to react with the article. At 608, products generated from the reaction between the radicals and the article are removed during the CMP process.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

In one embodiment, a system for performing chemical-mechanical planarization includes: a polishing head, a polishing pad, a slurry distribution component, and a reactant distribution component. The polishing head is configured to perform chemical-mechanical planarization on an article. The polishing pad is configured to support the article. The slurry distribution component is configured to provide a slurry on the polishing pad. The reactant distribution component is configured to provide an oxidizer material on the polishing pad to generate a plurality of radicals to react with the article.

In another embodiment, a method is provided for performing chemical-mechanical planarization. A slurry is provided for performing chemical-mechanical planarization (CMP) on an article. An oxidizer material is provided on the article for generating a plurality of radicals to react with the article. Products generated from the reaction between the radicals and the article are removed.

In yet another embodiment, a system for performing chemical-mechanical planarization includes: a polishing pad and a controller. The polishing pad is configured to support an article. The controller is configured to: provide a slurry for performing chemical-mechanical planarization (CMP) on an article, provide an oxidizer material on the article for generating a plurality of radicals to react with the article, and remove products generated from the reaction between the radicals and the article.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope or of what may be claimed, but rather as descriptions of features specific to particular embodiments. Certain features that are described in this specification in the context or separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments have been described. Other embodiments are within the scope of the following claims. For example, the actions recited in the claims can be performed in a different order and still achieve desirable results.

What is claimed is:

1. A system for performing chemical-mechanical planarization (CMP) on an article, the system comprising:
   a polishing head configured to hold the article;
   a polishing pad;
   a slurry distribution component configured to provide a slurry on the polishing pad;
   a catalyst material; and
   a reactant distribution component, independent of the slurry distribution component, having a single housing including an oxidizer conduit and a catalyst conduit, the reactant distribution component configured to provide an oxidizer material comprising a liquid, via the oxidizer conduit, on the polishing pad to generate a plurality of radicals to react with the article and separately providing the catalyst material, via the catalyst conduit, on the polishing pad to assist in generating the plurality of radicals, the oxidizer conduit and the catalyst conduit each being a separate conduit within the reactant distribution component delivering the oxidizer material and the catalyst material separately to the article.

2. The system of claim 1, further comprising the oxidizer material, wherein the oxidizer material and the catalyst material are independent of the slurry.

3. The system of claim 2, wherein conduit and the catalyst conduit define a distance therebetween less than a distance between the slurry distribution component and the reactant distribution component.

4. The system of claim 2, wherein the oxidizer material includes hydrogen peroxide.

5. The system of claim 2, wherein the plurality of radicals include hydroxyl radicals.

6. The system of claim 2, wherein the plurality of radicals react with a polymer material in the article and wherein separate delivery of the oxidizer material and the catalyst material via the oxidizer conduit and the catalyst conduit, respectively, facilitates generation of the plurality of radicals at the article.

7. The system of claim 1, wherein the polishing head is further configured to remove products generated from the reaction between the radicals and the article.

8. The system of claim 1, further comprising a controller coupled to a device selected from the group consisting of the polishing head, the slurry distribution component, and the reactant distribution component and configured to control operation of the device.

9. The system of claim 1, further comprising the slurry being provided by the slurry distribution component on the polishing pad.

10. The system of claim 1, wherein the catalyst material includes an iron-based material.

11. A system for performing chemical-mechanical planarization (CMP) on an article, the system comprising:
    a polishing head configured to hold the article;
    a polishing pad;
    a slurry distribution component configured to provide a slurry on the polishing pad;
    a catalyst material;
    a reactant distribution component configured to provide an oxidizer material comprising a liquid, via an oxidizer conduit, on the polishing pad to generate a plurality of radicals to react with the article, the reactant distribution component separately providing the catalyst material, via an catalyst conduit, on the polishing pad to assist in generating the plurality of radicals, the oxidizer conduit and the catalyst conduit each being a separate conduit within the reactant distribution component delivering the oxidizer material and the catalyst material separately to the article; and
    an ultraviolet light source adjacent to the reactant distribution component configured to emit an incident light on the oxidizer material.

12. The system of claim 11, further comprising the oxidizer material, wherein the reactant distribution component includes an oxidizer distribution component providing the oxidizer material on the polishing pad.

13. The system of claim 12, wherein the reactant distribution component further includes a catalyst distribution component through which the catalyst material is provided on the polishing pad and the oxidizer distribution component and the catalyst distribution component define a distance therebetween less than a distance between the slurry distribution component and the reactant distribution component.

14. The system of claim 12, wherein the oxidizer material includes hydrogen peroxide.

15. The system of claim 12, wherein the plurality of radicals include hydroxyl radicals and react with a polymer material in the article and wherein separate delivery of the oxidizer material and the catalyst material via the oxidizer conduit and the catalyst conduit, respectively, facilitates generation of the plurality of radicals at the article.

16. The system of claim 11, wherein the polishing head is further configured to remove products generated from the reaction between the radicals and the article.

17. The system of claim 11, further comprising a controller coupled to a device selected from the group consisting of the polishing head, the slurry distribution component, and the reactant distribution component and configured to control operation of the device.

18. The system of claim 11, further comprising the slurry being provided by the slurry distribution component on the polishing pad.

19. The system of claim 11, wherein the catalyst material includes an iron-based material.

20. A system for performing chemical-mechanical planarization (CMP) on an article, the system comprising:
    a polishing head configured to hold the article;
    a polishing pad;
    a slurry distribution component configured to provide a slurry on the polishing pad;
    a catalyst material;
    a reactant distribution component, independent of the slurry distribution component, having a single housing including an oxidizer conduit and a catalyst conduit, the reactant distribution component configured to provide an oxidizer material comprising a liquid, via the oxidizer conduit, on the polishing pad to generate a plurality of radicals to react with the article and separately providing the catalyst material, via the catalyst conduit, on the polishing pad to assist in generating the plurality of radicals, the oxidizer conduit and the catalyst conduit each being a separate conduit within the reactant distribution component delivering the oxidizer material and the catalyst material separately to the article; and
    an ultraviolet light source adjacent to the reactant distribution component configured to emit an incident light on the oxidizer material.

* * * * *